(12) United States Patent
Wang

(10) Patent No.: US 11,031,576 B2
(45) Date of Patent: Jun. 8, 2021

(54) OLED DISPLAY PANEL AND DISPLAY

(71) Applicants: BOE TECHNOLOGY GROUP CO., LTD., Beijing (CN); Hefei BOE Optoelectronics Technology Co., Ltd., Anhui (CN)

(72) Inventor: Chuanyan Wang, Beijing (CN)

(73) Assignees: BOE Technology Group Co., Ltd., Beijing (CN); Hefei BOE Optoelectronics Technology Co., Ltd., Anhui (CN)

( * ) Notice: Subject to any disclaimer, the term of this patent is extended or adjusted under 35 U.S.C. 154(b) by 379 days.

(21) Appl. No.: 16/081,884

(22) PCT Filed: Dec. 19, 2017

(86) PCT No.: PCT/CN2017/117100
§ 371 (c)(1),
(2) Date: Aug. 31, 2018

(87) PCT Pub. No.: WO2018/233248
PCT Pub. Date: Dec. 27, 2018

(65) Prior Publication Data
US 2021/0013450 A1 Jan. 14, 2021

(30) Foreign Application Priority Data
Jun. 22, 2017 (CN) .......................... 201710480778.0

(51) Int. Cl.
*H01L 51/52* (2006.01)
(52) U.S. Cl.
CPC ........ *H01L 51/5259* (2013.01); *H01L 51/524* (2013.01)

(58) Field of Classification Search
CPC .................... H01L 51/5259; H01L 51/524
See application file for complete search history.

(56) References Cited

U.S. PATENT DOCUMENTS 9,362,523 B2 6/2016 Zhang
2008/0305360 A1 12/2008 Han et al.
(Continued)

FOREIGN PATENT DOCUMENTS

AU 2014260477 A1 10/2015
CN 1242924 A 1/2000
(Continued)

OTHER PUBLICATIONS

Chinese Office Action dated May 2, 2018, from application No. 201710480778.0.
(Continued)

*Primary Examiner* — Anthony Ho
(74) *Attorney, Agent, or Firm* — Arch & Lake LLP

(57) ABSTRACT

The present disclosure relates to the field of display technology and discloses an OLED display panel and a display. The OLED display panel includes a base substrate, an OLED unit disposed on the base substrate, an organic layer disposed on the base substrate and covering the OLED unit, and a package cover disposed on a side of the organic layer away from the base substrate and is cell aligned with the base substrate, wherein the organic layer includes an organic material and a metal nitride capable of reacting with moisture to release ammonia gas. In the above OLED display panel, the organic layer is used to absorb the moisture contained in the gas entering the OLED display panel, delays the aging rate of the OLED unit, and prolongs the life of the OLED unit.

16 Claims, 2 Drawing Sheets

(56) References Cited

U.S. PATENT DOCUMENTS

2015/0221888 A1   8/2015  Zhang
2016/0088756 A1   3/2016  Ramadas

FOREIGN PATENT DOCUMENTS

| CN | 101471425 A | 7/2009 |
| CN | 103474561 A | 12/2013 |
| CN | 104882560 A | 9/2015 |
| CN | 105408104 A | 3/2016 |
| CN | 107104203 A | 8/2017 |
| EP | 2 991 824 A1 | 3/2016 |
| EP | 2 991 824 A4 | 3/2016 |
| WO | WO-2014/178798 A1 | 11/2014 |

OTHER PUBLICATIONS

International Search Report and Written Opinion dated Mar. 27, 2018, from application No. PCT/CN2017/117100.

OLED DISPLAY PANEL AND DISPLAY

CROSS REFERENCE

The present application is based upon International Application No. PCT/CN2017/117100, filed on Dec. 19, 2017, which is based upon and claims priority to Chinese Patent Application No. 201710480778.0, filed on Jun. 22, 2017, and entitled "OLED DISPLAY PANEL AND DISPLAY".

TECHNICAL FIELD

The present disclosure relates to the field of display technology, in particular, to an OLED display panel and a display.

BACKGROUND

In recent years, the organic light-emitting diode (OLED) display panel, which is an emerging display technology, has gradually emerged with its own advantages. Generally, its advantages are roughly as follows: 1. an OLED is a solid-state mechanism having no liquid substance inside, which has better impact resistance and thus is a drop-proof device; 2. the angle of view is large, and the picture is still not distorted even under a large viewing angle; 3. the response time of the OLED is one thousandth of that of the LCD (Liquid Crystal Display), which shows that the moving picture has no smear phenomenon; 4. the low temperature characteristic is good, and it can still display normally at minus 40 degrees; 5. it is self-luminescent with little light loss and lower power consumption; and 6. the dark state is darker and the contrast is high.

It should be noted that, information disclosed in the above background portion is provided only for better understanding of the background of the present disclosure, and thus it may contain information that does not form the prior art known by those ordinary skilled in the art.

SUMMARY

The present disclosure provides an OLED display panel and a display. The internal structure of the OLED display panel has been changed, and an organic layer is added. The organic layer can absorb the moisture carried in the gas inside the OLED display panel, thereby prolonging the lifespan of the OLED unit.

Following technical solutions are provided in the present disclosure for the above objective.

An OLED display panel including a base substrate, an OLED unit disposed on the base substrate, an organic layer disposed on the base substrate and covering the OLED unit, and a package cover disposed on a side of the organic layer away from the base substrate and is cell aligned with the base substrate, wherein the organic layer includes an organic material and a metal nitride capable of reacting with moisture to release ammonia gas.

In one embodiment, the organic layer further includes lignin.

In one embodiment, a mass ratio of the lignin in the organic layer is more than 0% and less than or equal to 10%.

In one embodiment, a closed cavity is formed between the organic layer and the package cover, and the closed cavity is filled with nitrogen gas, and the pressure of the nitrogen gas in the closed cavity is higher than a standard atmospheric pressure.

In one embodiment, the pressure of the nitrogen gas in the closed cavity is 1.05 to 1.2 times higher than the standard atmospheric pressure.

In one embodiment, the metal nitride is magnesium nitride, and the magnesium nitride accounts for 1% to 15% by mass in the organic layer.

In one embodiment, a silicon nitride layer is further disposed between the organic layer and the OLED unit, and the silicon nitride layer is used for isolating a gas and the OLED unit.

In one embodiment, the OLED display panel further includes a light shielding layer disposed on a side of the package cover facing the base substrate.

In one embodiment, the side of the organic layer away from the base substrate is further provided with a metal layer capable of forming a dense oxide film when oxidized by oxygen.

In one embodiment, the metal layer is non-transparent metal.

The present disclosure further provides a display including the OLED display panel according any one of the above technical solutions.

It is to be understood that both the foregoing general description and the following detailed description are exemplary and explanatory only and are not restrictive of the invention, as claimed.

This section provides a summary of various implementations or examples of the technology described in the disclosure, and is not a comprehensive disclosure of the full scope or all features of the disclosed technology.

DETAILED DESCRIPTION

Hereinafter, implementations according to embodiments of the present disclosure will be described clearly and fully with reference to the drawings of the embodiments of the present disclosure. It is obvious that the described embodiments are only a part of the embodiments of the present disclosure, but not all of the embodiments. All other embodiments obtained by those of ordinary skill in the art based on the embodiments of the present disclosure without creative work fall within the scope of the disclosure.

Figure 1:
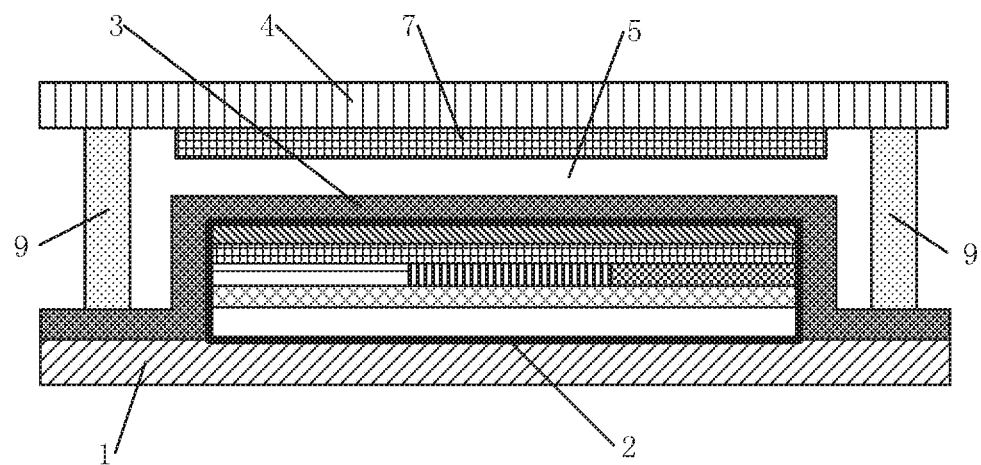
FIG. 1 is a structural schematic diagram in an embodiment of the OLED display panel provided in the present disclosure.

Referring to FIG. 1, an embodiment provides an OLED display panel including a base substrate 1, an OLED unit 2 disposed on the base substrate 1, an organic layer 3 disposed on the base substrate 1 and covering the OLED unit 2, and a package cover 4 disposed on a side of the organic layer 3 away from the base substrate 1 and is cell aligned with the base substrate 1, wherein the organic layer 3 includes an organic material and a metal nitride capable of reacting with moisture to release ammonia gas.

In the above OLED display panel, the OLED display panel includes a base substrate 1, an OLED unit 2, an organic layer 3, and a package cover 3 disposed on a side of the organic layer 3 away from the base substrate 1 and is cell aligned with the base substrate 1. Since the OLED unit 2 is disposed on the base substrate 1 and the organic layer 3 is disposed on the base substrate 1 and covers the OLED unit 2, after the package cover 4 and the OLED unit 2 are cell aligned to form the display panel, and after a long period of use, the gas entering the display panel is first contacted with the organic layer 3 and then contacted with the OLED unit 2. The organic layer 3 includes an organic material and a metal nitride capable of reacting with moisture to release ammonia gas. When the gas entering the display panel contains moisture, the metal nitride in the organic layer absorbs the moisture in the gas to perform a chemical reaction and consumes the moisture in the gas. Accordingly, the OLED unit 2 contacts little or no moisture in the gas entering the display panel, thereby delaying the aging rate of the OLED unit 2 and prolonging the service life. In the OLED display panel provided by some embodiments of the present disclosure, the organic layer 3 is used to absorb the moisture contained in the gas entering the OLED display panel, delays the aging rate of the OLED unit, and prolongs the life of the OLED unit.

Accordingly, in the above OLED display panel, the internal structure of the OLED display panel has been changed, and the organic layer 3 is added which can absorb the moisture carried in the gas inside the OLED display panel, thereby prolonging the lifespan of the OLED unit.

Based on the above embodiment, optionally, the organic layer 3 further includes lignin. It should be noted that when the organic layer 3 includes lignin and the gas entering the display panel contains moisture and oxygen, the metal nitride in the organic layer 3 may absorb the moisture in the gas and the lignin may absorb the oxygen in the gas to perform chemical reaction. The metal nitride and the lignin consumes the moisture and the oxygen in the gas, such that the OLED unit 2 contacts little or no moisture or oxygen in the gas entering the display panel, thereby delaying the aging rate of the OLED unit 2 and prolonging the service life.

Based on the above embodiment, it should be noted that the organic material may be an acrylic resin such as polymethacrylic resin. The metal nitride which reacts with water to release ammonia gas may be aluminum nitride or magnesium nitride and other metal nitride capable of reacting with water to release ammonia gas. The lignin may be a polymer containing a Guaiacyl-based structure, a Syringyl-based structure, or a Hydroxyl Phenyl-based structure.

Based on the above embodiment, optionally, a mass ratio of the lignin in the organic layer is more than 0% and less than or equal to 10%.

Based on the above embodiment, optionally, a closed cavity is formed between the organic layer 3 and the package cover 4, and the closed cavity is filled with nitrogen gas 5, and the pressure of the nitrogen gas 5 in the closed cavity is higher than a standard atmospheric pressure.

In particular, the nitrogen gas 5 is filled in the closed cavity between the organic layer 3 and the package cover 4. Since the pressure of the nitrogen gas 5 in the closed cavity is higher than a standard atmospheric pressure, the air outside the closed cavity cannot enter the inside of the closed cavity, and the nitrogen gas 5 forms the first layer of protection for the OLED unit 2. When the above OLED display panel is used for a long time, and the pressure of the protection layer of the nitrogen gas in the closed cavity is reduced, external moisture and oxygen in the air under the standard atmospheric pressure may enter the inside of the closed cavity. The organic layer 3 on the side of the OLED unit 2 away from the base substrate 1 absorbs water and oxygen in the air, and forms second layer of protection for the OLED unit 2.

The OLED display panel provided by the embodiment uses the organic layer 3 and the nitrogen gas 5 in the closed cavity to protect the OLED unit 2 in multiple layers, so that the OLED unit 2 can effectively prevent water and oxygen from affecting the structure in the OLED unit 2, can prevent the OLED unit 2 from aging, and can improve the service life of the OLED unit 2.

In addition, since the organic layer 3 includes a metal nitride which reacts with moisture to release ammonia gas, when the pressure of the nitrogen gas 5 in the closed cavity in the above OLED display panel is gradually reduced to less than a standard atmospheric pressure and moisture and oxygen in the air enters the closed cavity, the moisture and oxygen may be absorbed by the metal nitride and lignin in the organic layer 3, and ammonia gas is released, which increases the pressure in the closed cavity. Accordingly, the present disclosure effectively prevents moisture and oxygen from affecting the OLED unit 2 and improves the lifespan of the OLED unit 2.

Based on the above embodiment, optionally, the pressure of the nitrogen gas 5 in the closed cavity is 1.05 to 1.2 times higher than the standard atmospheric pressure.

In particular, within the range of 1.05 to 1.2 times higher than the standard atmospheric pressure, the pressure of the nitrogen gas 5 in the closed cavity may be 1.05, 1.1, 1.15 or 1.2 times higher than the standard atmospheric pressure.

It should be noted that when the nitrogen gas pressure in the closed cavity is stronger than a standard atmospheric pressure, the pressure difference with a standard atmospheric pressure can be used to prevent moisture and oxygen in the air from entering the closed cavity, and to prevent moisture and oxygen from affecting the structure of the OLED unit. Accordingly, it may prevent the OLED unit 2 from aging, improve the service life, and form the first layer of protection for the OLED unit 2.

It should be noted that the pressure of the nitrogen gas 5 in the closed cavity cannot exceed 1.2 times of a standard atmospheric pressure. If it exceeds 1.2 times, the pressure of the nitrogen gas 5 in the closed cavity is too high, which may cause the package sealant 9 used for cell aligning the package cover 4 and the OLED unit 2 to bear too much pressure and peeling may occur, thereby affecting the encapsulation effect of the above OLED display panel. Accordingly, the sealing performance of the closed cavity after cell aligning is lowered, and moisture and oxygen in the air may enter the inside of the closed cavity, resulting in the aging of the elements in the OLED unit 2 to shorten the service life.

Based on the above embodiment, optionally, the metal nitride is magnesium nitride, and the magnesium nitride accounts for 1% to 15% by mass in the organic layer.

It should be noted that when the mass ratio of magnesium nitride and lignin in the organic layer 3 is lower than the minimum ratio, the moisture absorption and oxygen absorption of the organic layer 3 is insufficient, and when the mass ratio of magnesium nitride and lignin in the organic layer 3 is higher than the maximum ratio, the coatability of the organic layer 3 may be decreased.

It should be noted that, the present embodiment is obtained based on the previous embodiment.

Figure 2:
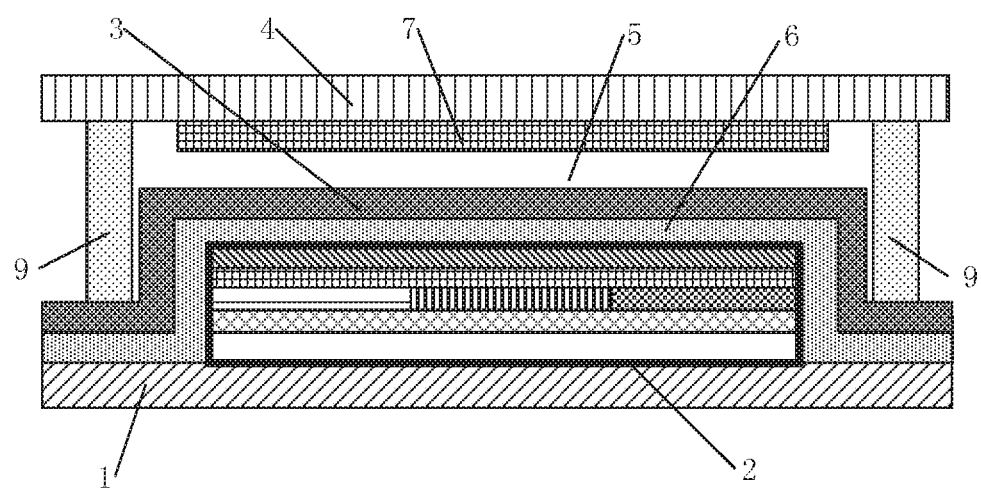
FIG. 2 is a structural schematic diagram in an embodiment of the OLED display panel provided in the present disclosure.

Referring to FIG. 2, in an embodiment, a silicon nitride layer 6 is further disposed between the organic layer 3 and the OLED unit 2, and the silicon nitride layer 6 is used for isolating a gas and the OLED unit 2.

It should be noted that the silicon nitride layer 6 isolates the OLED unit 2 from other substances and prevents the OLED unit 2 from contacting moisture and oxygen, thereby better extending the service life of the OLED unit 2.

On the basis of the above embodiments, the OLED display panel further includes a light shielding layer disposed on a side of the package cover facing the base substrate.

In particular, the light shielding layer is disposed on a side of the package cover 4 facing the base substrate 1, and the orthographic projection of the light shielding layer 7 on the base substrate 1 is located in the area where the OLED unit 2 is located.

It should be noted that the light shielding layer 7 can shield the display layer on the OLED unit 2 when the package sealant 9 is cured, so that the packaged OLED display panel has a normal display function and improves the yield of the finished product. The light shielding layer 7 may be the metal layer 8, or may be an organic substance layer to which a light shielding material is added.

It should be noted that, the present embodiment is obtained based on one of the above embodiment.

Figure 3:
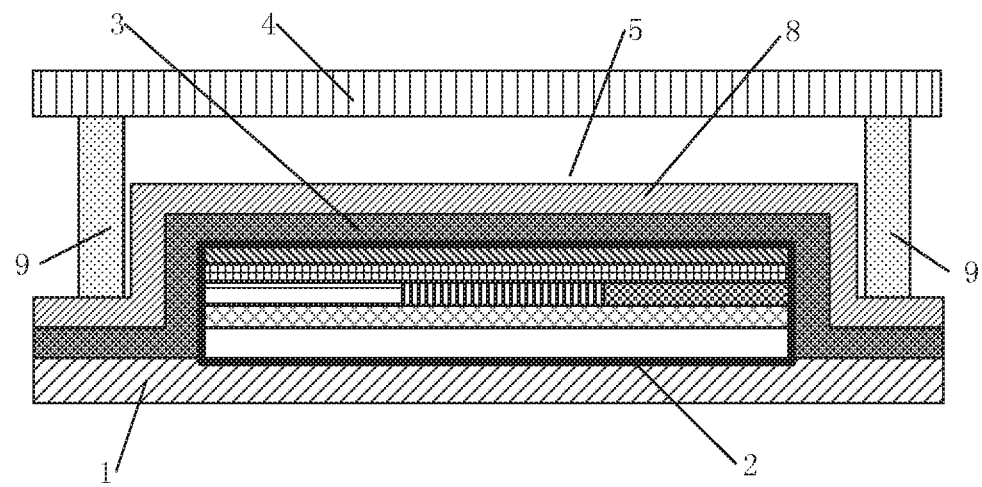
FIG. 3 is a structural schematic diagram in an embodiment of the OLED display panel provided in the present disclosure.

Referring to FIG. 3, in an embodiment, the side of the organic layer 3 away from the base substrate 1 is further provided with a metal layer 8 capable of forming a dense oxide film when oxidized by oxygen.

It should be noted that the metal layer 8 can shield the display layer of the OLED unit 2 when the package sealant 9 is sealed and cured, and can form a dense oxide when the metal encounters oxygen oxidation. The film forms protection of the organic layer 3, and delaying the oxygen and moisture in the gas entering the closed cavity from contacting and reacting with the organic layer 3, slowing the diffusion of oxygen and moisture to the OLED unit 2, and extending the useful life of the OLED unit 2.

On the basis of the above embodiment, the metal layer 8 is non-transparent metal.

It should be noted that when the metal layer 8 is a non-transparent metal, the same light shielding effect as the light shielding layer 7 can be achieved. Therefore, the light shielding layer 7 may be omitted, which simplifies the process flow and saves the space occupied by the light shielding layer 7, thereby facilitating the slim design of the OLED display panel provided by the present disclosure.

In particular, on the basis of the above embodiment, the OLED unit 2 includes an anode 20, a hole injection layer (HIL) 21, an organic light-emitting layer (EML) 22, an electron transport layer (ETL) 23, and a cathode 24 along a direction from the base substrate 1 to the package cover 4.

Figure 4:
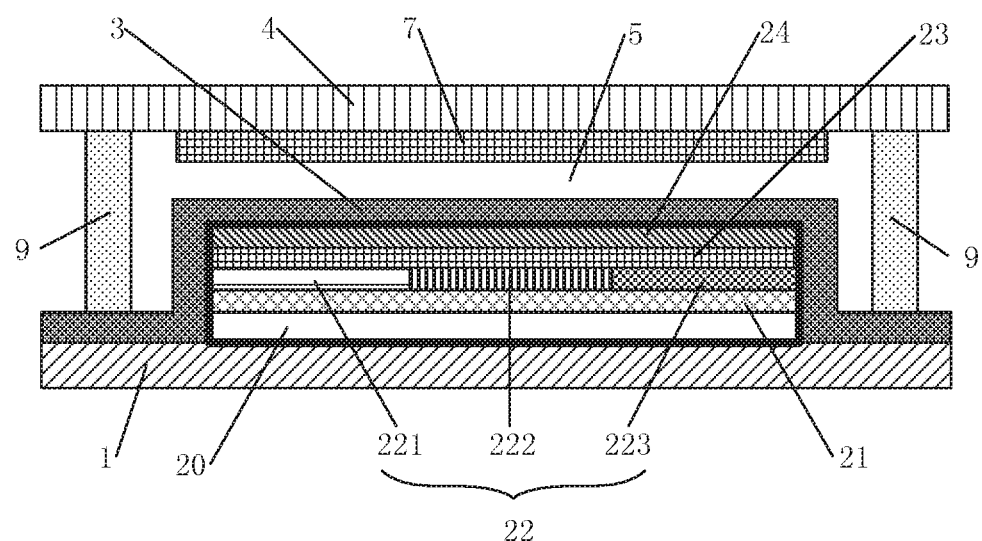
FIG. 4 is a structural schematic diagram of the OLED unit in an embodiment of the OLED display panel provided in the present disclosure.

It should be noted that the organic light-emitting layer 22 includes a red organic light-emitting layer 221, a green organic light-emitting layer 222, and a blue organic light-emitting layer 223. It can be seen from the above description that the OLED unit 2 is a conventional OLED unit 2, and the OLED display panel provided by the present disclosure does not change the structure of the OLED unit 2, but merely optimizes and changes the packaging process. The OLED display panel provided by the present disclosure has a wide range of application and is suitable for packaging of various OLED units 2. Referring to FIG. 4, in the embodiment, the display panel of the above embodiment is taken as an example.

The present disclosure further provides a display including the OLED display panel according any one of the above embodiments.

It is apparent that those skilled in the art can make various modifications and variations to the embodiments of the present invention without departing from the spirit and scope of the disclosure. In this way, it is intended that the present disclosure includes all these modifications and variations as long as they fall within the scope of the appended claims and their equivalents of the present disclosure.

What is claimed is:

1. An OLED display panel, comprising a base substrate, an OLED unit disposed on the base substrate, an organic layer disposed on the base substrate and covering the OLED unit, and a package cover disposed on a side of the organic layer away from the base substrate and is cell aligned with the base substrate, wherein:

the organic layer comprises an organic material and a metal nitride capable of reacting with moisture to release ammonia gas, wherein a closed cavity is formed between the organic layer and the package cover, and the closed cavity is filled with nitrogen gas, and a pressure of the nitrogen gas in the closed cavity is higher than a standard atmospheric pressure, wherein the pressure of the nitrogen gas in the closed cavity is 1.05 to 1.2 times higher than the standard atmospheric pressure.

2. The OLED display panel according to claim 1, wherein the organic layer further comprises lignin.

3. The OLED display panel according to claim 2, wherein a mass ratio of the lignin in the organic layer is more than 0% and less than or equal to 10%.

4. The OLED display panel according to claim 1, wherein the metal nitride is magnesium nitride, and the magnesium nitride accounts for 1% to 15% by mass in the organic layer.

5. The OLED display panel according to claim 1, wherein a silicon nitride layer is further disposed between the organic layer and the OLED unit, and the silicon nitride layer is used for isolating a gas and the OLED unit.

6. The OLED display panel according to claim 1, further comprising a light shielding layer disposed on a side of the package cover facing the base substrate.

7. The OLED display panel according to claim 1, wherein the side of the organic layer away from the base substrate is further provided with a metal layer capable of forming a dense oxide film when oxidized by oxygen.

8. The OLED display panel according to claim 7, wherein the metal layer is non-transparent metal.

9. A display, comprising an OLED display panel, wherein the display panel comprises: a base substrate, an OLED unit disposed on the base substrate, an organic layer disposed on the base substrate and covering the OLED unit, and a package cover disposed on a side of the organic layer away from the base substrate and is cell aligned with the base substrate, wherein:

the organic layer comprises an organic material and a metal nitride capable of reacting with moisture to release ammonia gas, wherein a closed cavity is formed between the organic layer and the package cover, and the closed cavity is filled with nitrogen gas, and a pressure of the nitrogen gas in the closed cavity is higher than a standard atmospheric pressure, and wherein the pressure of the nitrogen gas in the closed cavity is 1.05 to 1.2 times higher than the standard atmospheric pressure.

10. The display according to claim 9, wherein the organic layer further comprises lignin.

11. The display according to claim 10, wherein a mass ratio of the lignin in the organic layer is more than 0% and less than or equal to 10%.

12. The display according to claim 9, wherein the metal nitride is magnesium nitride, and the magnesium nitride accounts for 1% to 15% by mass in the organic layer.

13. The display according to claim 9, wherein a silicon nitride layer is further disposed between the organic layer and the OLED unit, and the silicon nitride layer is used for isolating a gas and the OLED unit.

14. The display according to claim 9, wherein the OLED display panel further comprises a light shielding layer disposed on a side of the package cover facing the base substrate.

15. The display according to claim 9, wherein the side of the organic layer away from the base substrate is further provided with a metal layer capable of forming a dense oxide film when oxidized by oxygen.

16. The display according to claim 15, wherein the metal layer is non-transparent metal.

* * * * *